July 6, 1965 J. B. SCHULTZ 3,193,767

TRANSISTOR RADIO SIGNAL RECEIVER WITH MEANS FOR REDUCING DISTORTION IN THE RF AMPLIFIER

Filed April 2, 1962 2 Sheets-Sheet 1

INVENTOR.
JOHN B. SCHULTZ
BY Eugene M. Whitacre
ATTORNEY

INVENTOR.
JOHN B. SCHULTZ
BY Eugene M. Whitacre
ATTORNEY

United States Patent Office 3,193,767

Patented July 6, 1965

3,193,767

TRANSISTOR RADIO SIGNAL RECEIVER WITH MEANS FOR REDUCING DISTORTION IN THE RF AMPLIFIER

John B. Schultz, Haddonfield, N.J., assignor to Radio Corporation of America, a corporation of Delaware Filed Apr. 2, 1962, Ser. No. 184,049
9 Claims. (Cl. 325—319)

This invention relates generally to radio signal receivers, and more particularly relates to automatic gain control (AGC) circuits for transistor receivers.

The signal level at the second detector of a radio signal receiver is maintained at a substantially constant level by the use of automatic gain control circuits which operate to reduce the gain of the radio frequency (R-F) and intermediate frequency (I-F) amplifiers as the received signal level increases. To obtain the best signal-to-noise ratio for a given receiver for the weakest signals to be received, the gain control action on the R-F amplifier is usually delayed so that the R-F amplifier operates at full gain for a range of received signals of low level. When the signal level increases sufficiently, the AGC delay on the R-F amplifier is removed and the gain of both the R-F and I-F amplifiers is reduced.

In transistor receivers, as the gain of the R-F amplifier is decreased by the application of a gain controlling voltage between the base and emitter electrodes of the transistor, the operating point of the transistor passes through a nonlinear portion of its collector current vs. emitter-base voltage characteristic, before reaching a point where the transistor is cut-off. Operation in this nonlinear portion of the transistor characteristic is particularly undesirable for amplitude modulation waves because of the resultant modulation distortion of the envelope of the received signal, and furthermore the nonlinear translation characteristic reduces the amount of interfering signal which is necessary to produce objectionable amounts of cross-modulation distortion as compared to that required when operating in the more linear portion of the operating characteristic.

It is accordingly an object of this invention to provide an improved automatic gain control circuit for transistor receivers.

It is a further object of this invention ot provide an improved transistor receiver for amplitude modulated radio waves in which operation in the nonlinear region of the collector current vs. base-emitter voltage of the R-F amplifier transistor is minimized to reduce the range of signals which are subjected to adverse cross-modulation and modulation distortion conditions.

A still further object of this invention is to provide an improved transistor receiving system capable of handling a wide range of received signal levels.

A receiver circuit embodying the invention, includes R-F and I-F transistor amplifiers which are coupled together by suitable frequency conversion circuits. An automatic gain control voltage is applied to the I-F amplifier in a manner to reduce the gain thereof as signal level increases. Delay circuit means interconnect the R-F and I-F amplifiers to apply the AGC voltage to the R-F amplifier after the received signal strength reaches a predetermined level. The R-F and I-F amplifiers are respectively connected so that when the AGC voltage is applied to the R-F amplifier a small change in the collector current of the I-F amplifier transistor produces a larger change in the collector current of the R-F amplifier transistor. Stated otherwise, a given change in gain controlling potential applied to the I-F amplifier produces less of a shift in the operating point therein than occurs in the R-F amplifier.

Thus for received signals of low level, gain control is effected only by the I-F amplifier, and the receiver operates to produce its best signal-to-noise ratio since the R-F amplifier operates at full gain and the bulk of the noise originates in the frequency converter stage following the R-F amplifier. When the received signal level increases to a value such that the signal-to-noise ratio at the second detector output is at a predetermined, acceptable level, the delay circuit means operates to apply the AGC voltage to the R-F amplifier stage. Due to the relative biasing characteristics of the R-F and I-F amplifier stages a further increase in signal level changes the R-F amplifier operating point without substantially affecting the I-F amplifier gain. Thus, only a relatively small change in signal levels is required to change the R-F amplifier bias voltage from its initial conditions to cut off, as compared to the case where the gain of the I-F amplifier is permitted to change appreciably at the same time. In this manner only signals in a limited range of received signal levels cause the R-F amplifier to operate in the nonlinear portion of its collector current vs. base-to-emitter voltage characteristic.

After the R-F amplifier is cut-off, higher levels of received signals are conveyed through the interelectrode capacitances of the R-F amplifier and further gain control is effected in the intermediate frequency amplifier channel of the receiver.

In accordance with one embodiment of the invention the automatic gain control potential is applied to the base electrode of an I-F amplifier transistor. A resistor is connected in circuit with the emitter electrode of the I-F amplifier transistor. A diode is connected between the emitter of the I-F amplifier transistor and the base of the R-F amplifier transistor. The diode is reverse biased so that for a first range of received signal levels of small value, the AGC voltage affects only the I-F stage and, because the diode presents a high impedance, the AGC voltage is not applied to the R-F amplifier stage. For a second range of received signal levels, the voltage across the I-F amplifier emitter resistor is changed sufficiently to forward bias the diode, and permit the application of the AGC voltage to the R-F transistor. The R-F and I-F transistors are connected in a manner such that further increases in signal level cause the R-F transistor to change its operating point toward the cut-off condition without substantially affecting the gain of the I-F amplifier.

In accordance with a feature of the invention, a signal bypass capacitor is connected between the electrode of a diode remote from the R-F amplifier base electrode and a point of reference potential. When the diode is conducting, a shunt signal path through the diode and the capacitor is provided between the input electrodes of the R-F transistor. Thus in addition to conveying the automatic gain control voltage to the R-F amplifier, the diode also operates to provide a shunt signal path across the R-F amplifier input circuit to reduce the level of signals applied thereto during the reception of strong signals. In this manner the AGC circuit of the invention further increases the range of signal levels which may be accommodated by the receiver over that which may be accommodated in the absence of the capacitor.

The novel features which are considered to be characteristic of this invention are set forth with particularity in the appended claims. The invention itself, however, both as to its organization and method of operation will best be understood from the following description when read in connection with the accompanying drawings in which:

Figure 1:
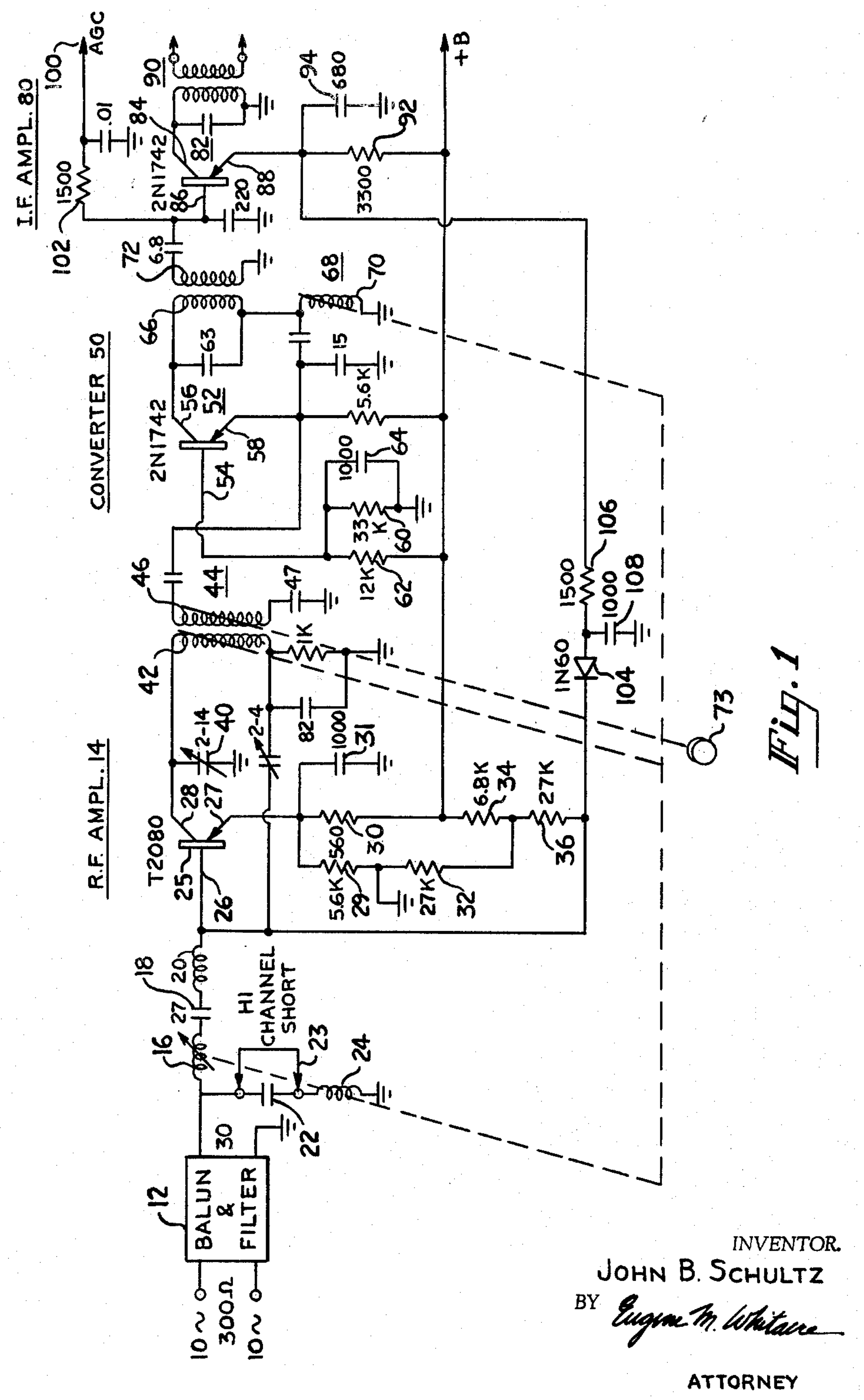
FIGURE 1 is a schematic circuit diagram partly in block form of a signal receiver embodying the invention.

Referring now to the drawings, and particularly to the circuit of FIGURE 1, the circuits shown are representative of the tuner and one intermediate frequency amplifier stage of a television receiver. It will be understood that the concepts of the invention are also applicable to transistor broadcast or communication receivers or the like.

The receiver includes a pair of input terminals 10 which are adapted for connection to an antenna, not shown. In the case of a television receiver the terminals 10 may be connected to the antenna through a balanced 300 ohm transmission line, and in turn the terminals 10 may be connected to the unbalanced input circuit of the R-F amplifier through a balance-to-unbalance transformer or balun, and suitable filtering networks to remove possible interfering signals, all of which are indicated by the rectangle 12. The signals appearing in the output terminals of the balun and filter network 12 are applied to the input electrode of the R-F amplifier 14 through a tuning inductor 16, a capacitor 18 and an inductor 20. The high signal potential output terminal for the balun and filter network 12 is coupled to ground through a capacitor 22 and an inductor 24. The capacitor 22 is shorted by a jumper 23 during the tuning of the high frequency channels 7–13.

The R-F amplifier 14 includes a transistor 25 having the usual base 26, emitter 27 and collector 28 electrodes. The initial bias for the R-F amplifier stage 14 is set by a pair of voltage divider networks connected respectively in the emitter and the base circuits of the transistor 25. In the emitter circuit of the transistor 25 a pair of resistors 29 and 30 are connected in series between ground and the positive terminal +B of an operating potential-supply source, not shown. The emitter electrode of the transistor 25 is connected to the junction of the resistors 29 and 30, and the values of the resistors are sufficiently large that the emitter voltage is substantially constant. It will be noted that the emitter electrode for the transistor 25 is by-passed to ground for signal frequencies through a capactor 31.

The voltage divider network for establishing the bias on the base electrode 26 of the transistor 25 includes a pair of resistors 32 and 34 which are respectively connected in series between ground and the +B terminal of the operating potential source. A positive voltage of lesser value than that which appears at the emitter electrode 27 is developed at the junction of the resistors 32 and 34 and is applied to the base electrode 26 through a resistor 36.

Signals which are amplified by the R-F amplifier 14 are developed in an output circuit 40 which is effectively connected between the collector 28 and emitter 27 electrodes of the transistor 25, and which is tunable by an inductor 42 to the frequency of a desired signal to be received.

Signals from the R-F amplifier output circuit 40 are coupled to the signal input circuit 44 of a self-oscillating converter stage 50. The input circuit 44 includes an inductor 46 which is also tunable to the frequency of a signal to be received. The converter 50 includes a transistor 52 having a base 54, collector 56 and emitter 58 electrodes. The appropriate bias for the transistor 52 is applied to the base electrode 54 from a voltage divider including a pair of resistors 60 and 62 which are connected in series between ground and the +B terminal. The base 54 is effectively connected to ground for signal and oscillator frequencies by a capacitor 64.

The converter stage 50 also includes an output circuit 66 fixedly tuned to the receiver intermediate frequency, and an oscillator circuit 68 tuned to the desired frequency of oscillation by a variable inductor 70.

The oscillator tuning inductor 70 and the signal selection tuning inductors 68, 42 and 46 are ganged for unicontrol operation as indicated by the dashed line 71, by a front panel tuning or channel selector control knob 73. The oscillator circuit 68 and I-F output circuit 66 are connected in series between the collector electrode 56 and ground. In operation, signals from the input circuit 44 are applied to the converter transistor 52 together with locally developed oscillator signals appearing across the oscillator tank circuit 68. The nonlinear interaction of the received signal and oscillator waves in the transistor 52 produce heterodyne components including a difference frequency signal which is developed across the I-F output circuit 66.

The resultant intermediate frequency wave is coupled from the output circuit 66 to an I-F input circuit 72 for a first I-F amplifier stage 80. The I-F amplifier stage 80 includes a transistor 82 having a collector 84, base 86 and an emitter electrode 88. This stage is connected as a common emitter amplifier with the input circuit 72 being connected to the base electrode 86, and an intermediate frequency output circuit 90 effectively connected between the collector 84 and emitter 88.

A resistor 92 connects the emitter electrode 88 to the source of polarizing potential +B for the transistor 82. It will be noted that the resistor 92 is partially bypassed for intermediate frequencies by a capacitor 94. The output circuit 90 for the I-F amplifier stage 80 is coupled to the desired utilization circuits which may include the remaining circuits of a television receiver. In any case the utilization circuits include means for developing an automatic gain control signal as a function of received signal level. In the present case, the automatic gain control developing circuit provides a voltage at an AGC terminal 100 which tends to become more positive with increases in signal level.

The AGC terminal 100 is coupled through a resistor 102 to the base electrode 86 of the transistor 82. Changes in received signal level cause the AGC circuit to produce a change in current through the I-F amplifier stage 82 thus causing a change in voltage across the emitter resistor 92. The voltage across the resistor 92 is applied through a resistor 106 to a diode 104, the cathode of which is connected to the base electrode of R-F amplifier 14. A capacitor 108 which provides low impedance at signal frequencies couples the anode of the diode 104 to ground.

Initially, the parameters of the I-F amplifier stage 80 are adjusted such that the voltage applied to the anode of the diode 104 is less positive than the voltage applied to the cathode of the diode from the voltage divider network including the resistors 32 and 34. As a result the diode initially appears effectively as an open circuit and has little effect upon the operation of the receiver. For small signals any AGC voltage which is developed is applied through the terminal 100 and resistor 102 to the base electrode 86 of the I-F amplifier stage 80. Since the bias at the base electrode 86 becomes more positive as signal level increases the gain of the I-F amplifier stage 80 is reduced. The I-F amplifier stage gain is shown by the solid line 110 and the R-F amplifier gain is shown by the dashed curve 111 of FIGURE 2.

The portion **110*a* of the curve 110 shows that the I-F amplifier 80 gain decreases as the signal level increases from the sensitivity level of the receiver, or the smallest received signal level which the receiver can acceptably translate. In the meantime the R-F amplifier stage 14 operates at full gain as its indicated by the portion 111*a* of the curve 111. The reduction in gain of the I-F amplifier 80 prevents overloading of succeeding stages in the receiver. However, since the maximum gain is available from the R-F amplifier stage 14**, the overall signal to noise ratio at the output of the receiver system is optimum because the bulk of the noise contributed by the receiver originates in the converter stage 50 which follows the R-F amplifier 14. Accordingly, maximum signal power is available because the R-F amplifier stage 14 operates at full gain, and optimum signal-to-noise ratio of the receiver system is effected.

Figures 2, 3:
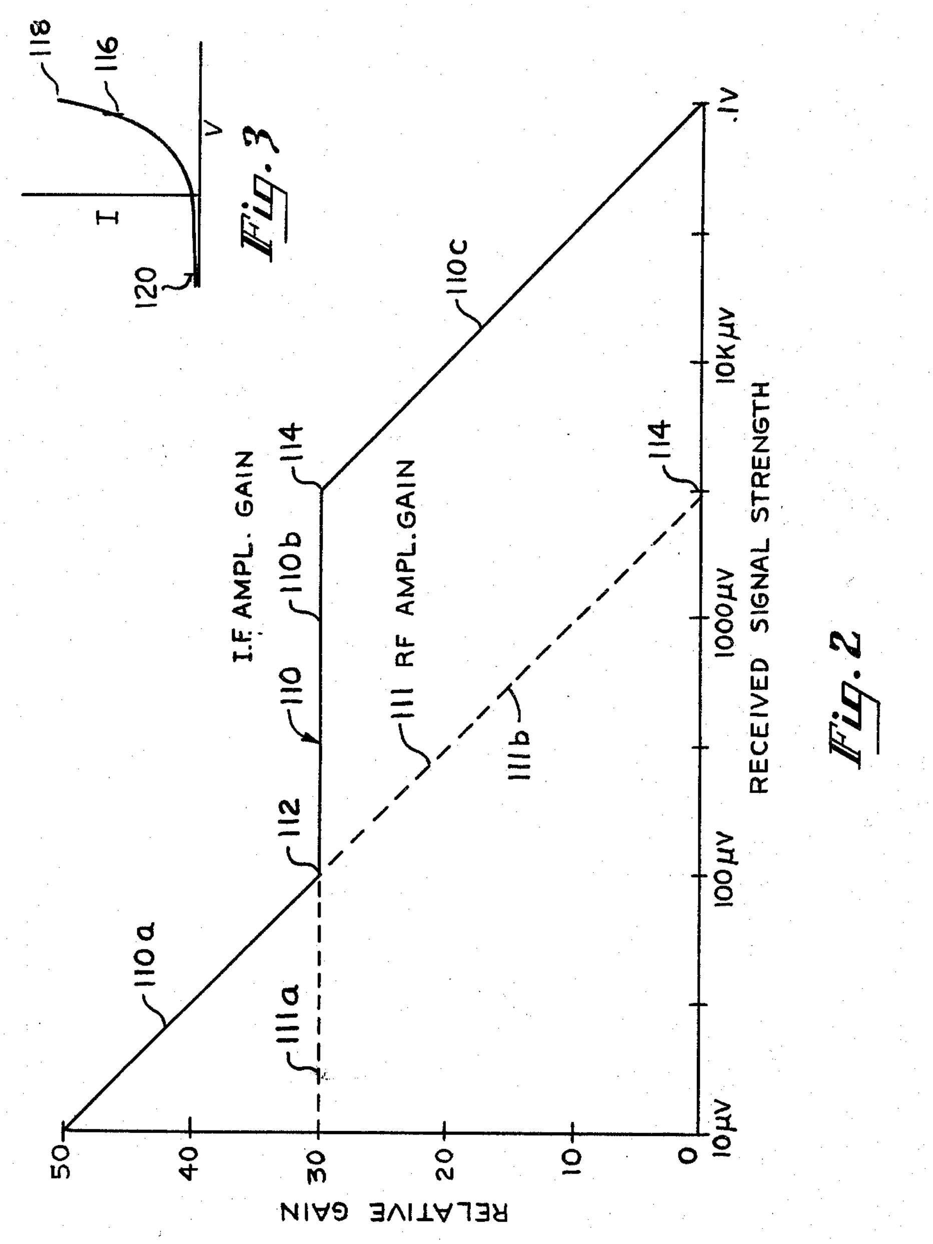
FIGURE 2 is a graph illustrating the relative gain control characteristics of the R-F and I-F amplifier stages of the receiver shown in FIGURE 1; and, FIGURE 3 is a graph illustrating the collector current vs. base-emitter voltage of a transistor of the type used in the R-F and I-F amplifier stages of the receiver shown in FIGURE 1.

At some arbitrary point 112 of FIGURE 2, as the received signal level increases, the signal to noise ratio will become high enough to provide the desired overall receiver performance. The system is set up so that at the signal level corresponding to point 112, the voltage at the emitter electrode 88 becomes sufficiently positive to cause the diode 104 to become forward biased, and further increases in signal level will produce a change in the operating point of the R-F amplifier 14 as is indicated by the portion 111*b* of the curve of FIGURE 2.

It will be noted also, that further increases in signal level produce a substantially greater effect on the gain of the R-F amplifier stage 14 than on the I-F amplifier stage 80, and the amplifier stage gain remains substantially constant as indicated by the portion 110*b* of the curve 110. The I-F amplifier stage 80 is connected to provide D.-C. degeneration. Thus, changes in the AGC voltage applied to the I-F amplifier 80 produce a degenerative change in current through the resistor 92 which tends to readjust the emitter 88-base 86 voltage in a direction toward its initial condition. However in the case of the R-F amplifier 14 the emitter electrode 27 is held at a relatively fixed voltage by the voltage divider including the resistors 29 and 30. The fact that the emitter voltage of the R-F amplifier 14 is relatively fixed tends to keep the emitter-base voltage of the transistor 25 from adjusting itself as the signal level continues to increase. The R-F and I-F amplifier connections are such that for a relatively small change of collector 56 current of the I-F amplifier 52, a relatively large change is produced in the collector 28 current of the R-F amplifier transistor 25. In this manner the gain of the I-F amplifier remains substantially constant for an intermediate range of received signal levels while the R-F amplifier gain is changed from that at its initial operating point which is indicated as point 116 of the collector current vs. base-emitter voltage curve of FIGURE 3, to cutoff at some point 120.

As the operating point 116 is moved to the left along the curve 118 of FIGURE 3, the transistor 25 will be operated in a nonlinear portion of its characteristic curve. Amplitude modulated signals applied to this transistor are then subject to amplitude distortion such as compression of negative excursions of applied signals as compared to the positive excursions. Furthermore the nonlinear curvature about the knee of the curve 118 increases the susceptibility to cross-modulation distortion in that a smaller amount of interfering signal produces a given objectionable level of cross modulation distortion than when operating on more linear portions.

As the received signal levels continue to increase, the R-F amplifier stage 14 eventually becomes cut off as at point 114, and signal transfer therethrough is effected by way of the base-to-collector capacitance. To the converter stage 50 and to the base 86 of the I-F amplifier 80. Accordingly, the gain of the I-F amplifier stage 80 is reduced by the AGC circuits in response to further increases in signal level as is shown by the portion 110*c* of the curve 110.

Thus optimum signal-to-noise operation for low levels of received signals is effected by permitting the R-F amplifier to operate at full gain for a range of signals near the sensitivity level. The R-F amplifier gain is reduced only after a predetermined signal-to-noise ratio at the receiver output has been achieved. To prevent modulation and cross modulation distortion, the R-F amplifier is designed to be cut off quickly to minimize the susceptibility of the system to modulation distortion and cross modulation. To this end the gain of the I-F amplifier remains substantially constant while the R-F amplifier gain is reduced.

An AGC circuit embodying the invention is particularly useful for AM receivers of high frequency radio waves, such as, for example, in the VHF television band. The input resistance of a transistor amplifier is an inverse function of frequency. Thus a received VHF wave of a given power causes less voltage to be developed, and hence is not so effective in developing an AGC voltage as a lower frequency wave. The circuit of the invention insures that the gain of the R-F amplifier will be reduced sufficiently fast to minimize the range of received signals which cause the R-F amplifier to operate on the nonlinear portion of its collector current vs. emitter base voltage characteristic. Further increases of signal level then result in a reduction of the gain in the I-F amplifier channel.

The diode 104 and capacitor 108 operates as shunt signal path across the input circuit of the I-F amplifier 14 to further increase the signal handling capabilities of the receiver during the reception of high level signals. The shunting action of the diode 104 and capacitor 108 provides signal attenuation in addition to that effected by the AGC action, thereby extending the overall signal handling capabilities of the receiver.

What is claimed is:

1. In a signal receiver, a radio frequency amplifier including a transistor having a collector current vs. emitter-base voltage characteristic having a nonlinear portion for a first region of relatively low emitter-base forward bias voltages and a relatively more linear portion for a second region of larger emitter-base forward bias voltages, said amplifier initially biased to an operating point on the relatively linear portion of said characteristic, but when biased to an operating point in the nonlinear region of its operating characteristic being subject to increased susceptibility to cross modulation distortion;

an intermediate frequency amplifier stage including a transistor, coupled to said radio frequency amplifier;

automatic gain control circuit means connected to continuously apply to at least one electrode of said intermediate frequency amplifier transistor a unidirectional potential which varies in accordance with the magnitude of received signals;

means in said intermediate frequency amplifier to develop a second unidirectional potential corresponding to said first unidirectional potential;

circuit means interconnecting said radio frequency amplifier and said intermediate frequency amplifier to apply said second unidirectional potential to said radio frequency amplifier stage to reduce the emitter-base forward bias voltage thereof with increases in signal level and thus cause the operating point to shift in a direction from the initial operating point toward the nonlinear portion of the collector current vs. emitter-base voltage characteristic of the transistor;

and means for providing an incremental change in collector current of the intermediate frequency amplifier that is substantially less than the incremental change in the collector current of said radio frequency amplifier stage for a given change in signal level, so that for changes of signal level in a predetermined range of signals substantially only the gain of said radio frequency amplifier is changed, thereby reducing the range of signal levels for which said radio frequency amplifier operating point is in said nonlinear portion of said collector current vs. emitter-base voltage characteristic.

2. In a signal receiver, a radio frequency amplifier including a transistor having a base, emitter and collector electrodes, said transistor having a collector current vs. emitter-base voltage characteristic having a nonlinear portion for a first region of relatively low emitter-base forward bias voltages and a relatively more linear portion for a second region of larger emitter-base forward bias voltages, said amplifier initially biased to an operating point on the relatively linear portion of said characteristic, but when biased to an operating point in the nonlinear region of its operating characteristic being subject to increased susceptibility to cross-modulation distortion;

an intermediate frequency amplifier stage including a transistor having base, emitter and collector electrodes, coupled to said radio frequency amplifier;

automatic gain control circuit means connected to continuously apply to at least one electrode of said intermediate frequency amplifier transistor a unidirectional potential which varies in accordance with the magnitude of received signals;

means in said intermediate frequency amplifier to develop a second unidirectional potential corresponding to said first unidirectional potential;

circuit means including a diode direct current conductively interconnecting said radio frequency amplifier and said intermediate frequency amplifier to apply said second unidirectional potential to reduce the emitter-base forward bias voltage of said radio frequency amplifier stage with increases in signal level to cause the operating point thereof to shift in a direction from the initial operating point toward the nonlinear portion of the collector current vs. emitter-base voltage characteristic of the transistor;

delay circuit means for maintaining said diode cut-off for a first range of received signals of low level to block the application of said second unidirectional potential to said radio frequency amplifier, but insufficient to maintain said diode cut-off for signal levels above said first range; and means for providing an incremental change in collector current of said intermediate frequency amplifier that is substantially less than the incremental change in the collector current of said radio frequency amplifier stage in response to a given change in signal level above said first range, so that for changes of signal level in a predetermined range of signals substantially only the gain of said radio frequency amplifier is changed, thereby reducing the range of signal levels for which said radio frequency amplifier operating point is in said nonlinear portion of said collector current vs. emitter-base voltage characteristic.

3. In a signal receiver, a radio frequency amplifier including a transistor having base, emitter and collector electrodes, said transistor having a collector current vs. emitter-base voltage characteristic having a nonlinear portion for a first region of relatively low emitter-base forward bias voltages and a relatively more linear portion for a second region of larger emitter-base forward bias voltages, said amplifier initially biased to an operating point on the relatively linear portion of said characteristic, but when biased to an operating point in the nonlinear region of its operating characteristic being subject to increased susceptibility to cross modulation distortion;

an input circuit having a high signal potential side and a low signal potential side connected between said base and emitter electrodes of said radio frequency amplifier;

an intermediate frequency amplifier stage including a transistor having base, emitter and collector electrodes;

automatic gain control circuit means connected to continuously apply to at least one electrode of said intermediate frequency amplifier transistor a unidirectional potential which varies in accordance with the magnitude of received signals;

means in said intermediate frequency amplifier to develop a second unidirectional potential corresponding to said first unidirectional potential;

circuit means including a diode direct current conductively interconnecting the high signal potential side of said radio frequency amplifier output circuit and said intermediate frequency amplifier to apply said second unidirectional potential from said intermediate frequency amplifier stage to reduce the emitter-base forward bias voltage of said radio frequency amplifier stage with increases in signal level to cause the operating point thereof to shift in a direction from the initial operating point towards the nonlinear portion of the collector current vs. emitter-base voltage characteristic of the transistor;

a signal bypass capacitor connected between the electrode of said diode connected to said intermediate frequency amplifier and the low signal potential side of said radio frequency amplifier input circuit, a delay circuit means for maintaining said diode cut-off for a first range of received signals of low level to block the application of said second unidirectional potential to said radio frequency amplifier but insufficient to maintain said diode cut-off for signal levels above those in said first range; and means for providing an incremental change in collector current of said intermediate frequency amplifier that is substantially less than the incremental change in the collector current of said radio frequency amplifier stage in response to a given change in signal level above said first range, so that for changes of signal level in a predetermined range of signals substantially only the gain of said radio frequency amplifier is changed, thereby reducing the range of signal levels for which said radio frequency amplifier operating point is in said nonlinear portion of said collector current vs. emitter-base voltage characteristic.

4. In a signal receiver of the type comprising a radio frequency amplifier stage including a transistor having base, emitter and collector electrodes, and having a signal input circuit connected between said base and emitter electrodes, an intermediate frequency amplifier stage comprising a transistor including base, emitter and collector electrodes means providing an automatic gain control circuit for developing a control voltage the magnitude of which is a function of the received signal level, and means for applying said control voltage to a gain controlling electrode of said intermediate-frequency amplifier stage transistor to reduce the gain thereof as signal level increases, the combination comprising, a direct current load impedance element connected in the emitter-collector current path of said intermediate frequency amplifier stage transistor to develop a direct voltage corresponding to said control voltage, voltage responsive nonlinear impedance means connected across the radio frequency amplifier stage input circuit and to said load impedance element for applying said direct voltage to a gain controlling electrode of said radio frequency amplifier stage transistor so that the base-emitter current and the gain of said radio frequency amplifier is reduced as signal level increases, and means for providing a greater incremental change in collector current of said radio frequency amplifier than the incremental change in collector current of said intermediate frequency amplifier for a given change of signal level so that for changes of signal level in a predetermined range of signals substantially only the gain of said radio frequency amplifier is changed.

5. A signal receiver comprising, a radio frequency amplifier stage including a transistor having a base, emitter and collector electrodes, a signal input circuit connected between said base and emitter electrodes, and a signal output circuit connected between said collector and emitter electrodes, a frequency converter coupled to said output circuit for converting a radio frequency carrier wave to corresponding wave of intermediate frequency, an intermediate frequency amplifier stage comprising a transistor including base, emitter and collector electrodes, an input circuit coupled to said frequency converter and connected between the base and emitter electrode of said intermediate frequency amplifier stage transistor, an intermediate frequency output circuit connected between the collector and emitter electrodes of the intermediate frequency amplifier stage transistor, means providing an automatic gain control circuit for developing a control voltage the magnitude of which is a function of the received signal level, means for applying said control voltage to the base electrode of said intermediate-frequency amplifier stage transistor in a manner to reduce the gain thereof as signal level increases, a resistor connected in the emitter-collector current path of said intermediate frequency amplifier stage transistor to provide an amplified direct-current voltage corresponding to said control voltage, a diode coupled between said resistor and the base electrode of said radio frequency amplifier transistor stage, means providing a reverse bias for said diode to maintain said diode cut-off for a first range of received signals of low level, said diode being poled so that said reverse bias is decreased as the current through said resistor decreases in response to changes of said control voltage caused by increasing signal levels, the magnitude of said reverse bias being such that said diode becomes forward biased when the received signals are of a higher level than signals in said first range to apply the voltage developed across said resistor to the base electrode of said radio frequency amplifier transistor and biasing circuit means connected to said radio frequency amplifier stage transistor for producing a change in collector current in the radio frequency amplifier stage transistor which is greater than the change in collector current produced in said intermediate frequency amplifier stage transistor for a predetermined change in signal level.

6. A signal receiver comprising, a radio frequency amplifier stage including a transistor having base, emitter and collector electrodes, a signal input circuit connected between said base and emitter electrodes, means connecting said emitter electrode to a point of substantially fixed potential, an output circuit connected between said collector and emitter electrodes, a frequency converter coupled to said output circuit for converting a radio frequency carrier wave to corresponding wave of intermediate frequency, an intermediate frequency amplifier stage comprising a transistor of the same conductivity type as said radio frequency amplifier transistor including base, emitter and collector electrodes, an input circuit coupled to said frequency converter and connected between the base and emitter electrode of said intermediate frequency amplifier stage transistor, an intermediate frequency output circuit connected between the collector and emitter electrodes of the intermediate frequency amplifier stage transistor, means providing an automatic gain control circuit for developing a control voltage the magnitude of which is a function of the received signal level, means for applying said control voltage to the base electrode of said intermediate-frequency amplifier stage transistor in a polarity to reduce the gain thereof as signal level increases, a resistor connected between the emitter electrode of said intermediate frequency amplifier stage transistor and said output circuit to provide direct-current degeneration for said intermediate frequency amplifier, a diode coupled between the emitter electrode of said intermediate frequency amplifier stage transistor and the base electrode of said radio frequency amplifier stage transistor, means providing a reverse bias for said diode to maintain said diode cut-off for a first range of received signals of low level, said diode being poled so that said reverse bias is decreased as the current through said resistor decreases in response to changes of said control voltage caused by increasing signal levels, the magnitude of said reverse bias being such that said diode becomes forward biased when the received signals are of a higher level than signals in said first range to apply the voltage developed across said resistor to the base electrode of said radio frequency amplifier transistor and biasing circuit means connected to said radio frequency amplifier stage transistor for producing a change in collector current in the radio frequency amplifier stage transistor which is greater than the change in collector current produced in said intermediate frequency amplifier stage transistor for a predetermined change in signal level.

7. A signal receiver comprising a radio frequency amplifier stage including a PNP transistor having a base, emitter, and collector electrodes, a signal input circuit connected between said base and emitter, and collector electrodes, a source of operating potential having a positive terminal and a negative terminal, means providing a point of reference potential in said receiver connected to said negative terminal, a voltage divider including first and second resistors connected in series between said positive and negative terminals, the current through said voltage divider being substantially greater than the current through said radio frequency amplifier transistor, means connecting said emitter electrode to the junction of said pair of resistors, an output circuit connected between said collector and emitter electrodes, a frequency converter coupled to said output circuit for converting a radio frequency carrier wave to corresponding wave of intermediate frequency, an intermediate frequency amplifier stage comprising a PNP transistor including base, emitter and collector electrode, an intermediate frequency input circuit coupled to said frequency converter and connected between the base and emitter electrode of said intermediate frequency amplifier stage transistor, an intermediate frequency output circuit connected between the collector electrodes of the intermediate frequency amplifier stage transistor and the negative terminal of said source, means providing an automatic gain control circuit for developing a control voltage which becomes increasingly more positive as the received signal level increases, means for applying said control voltage to the base electrode of said intermediate-frequency amplifier stage transistor, a third resistor connected between the emitter electrode of said intermediate frequency amplifier stage transistor and the positive terminal of said source, the magnitude of said resistor being such as to provide a greater amount of direct-current degeneration in said intermediate frequency amplifier stage than in said radio frequency amplifier stage, a diode having an anode direct current conductively connected to the emitter electrode of said intermediate frequency amplifier stage transistor and a cathode direct current conductively connected to the base electrode of said radio frequency amplifier stage transistor, means providing a voltage divider connected across the terminals of said source connected to the cathode of said diode to apply a positive delay voltage thereto which exceeds the positive voltage at the emitter of said intermediate frequency amplifier transistor under quiescent conditions, the magnitude of said delay voltage being selected to hold said diode cut-off during reception of signals below said predetermined threshold level, and to render said diode conductive for signals above said predetermined threshold level, so that the gain of said radio frequency amplifier stage is reduced for a range of signals above said predetermined threshold level while the gain of said intermediate frequency amplifier stage remains substantially constant.

8. A signal receiver as defined in claim 7 including a signal bypass capacitor connected between the anode of said diode and said point of reference potential.

9. A signal receiver as defined in claim 8 including an isolating resistor connected between the anode of said diode and the emitter electrodes of said intermediate frequency amplifier stage.

References Cited by the Examiner

UNITED STATES PATENTS

| | | | |
|---|---|---|---|
| 2,939,950 | 6/60 | Holmes | 325—319 XR |
| 2,961,534 | 11/60 | Scott | 325—319 |
| 3,022,421 | 2/62 | Nygaard et al. | 325—319 |
| 3,030,504 | 4/62 | Oschmann | 325—319 XR |
| 3,036,211 | 5/62 | Broadhead et al. | 325—410 XR |

DAVID G. REDINBAUGH, *Primary Examiner.*